United States Patent
Zhang et al.

(12)
(10) Patent No.: US 6,294,458 B1
(45) Date of Patent: Sep. 25, 2001

(54) SEMICONDUCTOR DEVICE ADHESIVE LAYER STRUCTURE AND PROCESS FOR FORMING STRUCTURE

(75) Inventors: Jiming Zhang, Austin; Dean J. Denning, Del Valle; Sam S. Garcia; Scott K. Pozder, both of Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/494,458

(22) Filed: Jan. 31, 2000

(51) Int. Cl.⁷ .............................. H01L 21/4763
(52) U.S. Cl. .................. 438/627; 438/628; 438/643; 438/644; 438/687
(58) Field of Search .................... 438/625, 627, 438/628, 633, 637, 639, 642, 643, 644, 648, 687, 906

(56) References Cited

U.S. PATENT DOCUMENTS

| | | | |
|---|---|---|---|
| 5,270,267 | * 12/1993 | Ouellet | 438/597 |
| 5,447,613 | * 9/1995 | Ouellet | 204/192.1 |
| 6,013,581 | * 1/2000 | Wu et al. | 438/734 |
| 6,066,677 | * 5/2000 | Cooney, III et al. | 438/787 |
| 6,177,350 | * 1/2001 | Sundarrajan et al. | 438/688 |

\* cited by examiner

Primary Examiner—Amir Zarabian
Assistant Examiner—Christian D. Wilson
(74) Attorney, Agent, or Firm—James L. Clingan, Jr.

(57) ABSTRACT

The formation of an adhesion/interlayer region (410) of a semiconductor substrate device (404) before barrier layer (412) deposition provides improved adhesion of the barrier layer (412) to the underlying dielectric (404) and increases strength to the next interconnect layer without altering the function of the barrier layer (412) to limit Cu diffusion into the dielectric substrate (404). The adhesion/interlayer region (410) is formed in an inlaid structure (400, 500) of a semiconductor wafer. The inlaid structure (400, 500) is connected to upper or lower metal layers through vias in the dielectric layer (404) to a copper layer. The adhesion/interlayer region is formed by flowing a treating gas in a glow discharge process of the dielectric substrate in a chamber either attached or separated from the barrier deposition chamber (300). The barrier layer (412) and the adhesion/interlayer region (410) can be formed in this inlaid structure (400, 500) of a semiconductor wafer. The treating gas (212, 320) can be nitrogen, hydrogen, gases containing carbon atoms, or some other suitable gas.

24 Claims, 3 Drawing Sheets

US 6,294,458 B1

SEMICONDUCTOR DEVICE ADHESIVE LAYER STRUCTURE AND PROCESS FOR FORMING STRUCTURE

FIELD OF THE INVENTION

The invention relates generally to semiconductor devices and, more particularly, to an inlaid interconnect feature with improved adhesion between conductor and dielectric materials.

RELATED ART

Integrated circuits are formed on semiconductor substrates using a number of different processing operations that create the transistor and interconnect elements. In order to access transistor elements associated with the semiconductor substrate, metal vias and interconnects are formed in dielectric materials as part of the integrated circuits. The inlaid metal vias and interconnects provide the means for transfer of electrical signals and power between transistors, internal circuits, circuits external to the die, and other aspects.

Semiconductor devices usually include a semiconductor device substrate, field isolation regions, and doped regions formed within the semiconductor device substrate. A gate dielectric layer overlies portions of the semiconductor device substrate, and a gate electrode overlies the gate dielectric layer. Spacers are formed adjacent the sidewalls of the gate electrode. A first interlevel dielectric layer (IDL) is patterned to form a contact opening that is filled with a contact fill material, and optionally a barrier layer. The barrier layer is typically a refractory metal, a refractory metal nitride, or a combination of refractory metals or their nitrides. The contact fill material typically includes tungsten, polysilicon, or the like. After depositing the barrier layer and the contact fill material, the substrate is polished to remove portions of the barrier layer and contact fill material not contained within the contact opening to form the conductive plug.

A first level interconnect is then formed overlying the interlevel dielectric (ILD) layer and the conductive plug. The first level interconnect can be formed using a combination of trench and polishing processes or, alternatively, using a combination of patterning and etching processes. If the first level interconnect is formed using copper, a barrier may be formed adjacent to the first level interconnect to reduce the migration of copper into surrounding materials. The first level interconnect is formed, for example, as a single inlaid structure. As such, the first level interconnect is created by first depositing a portion of a second ILD which is then etched to form a trench in which the material that makes up the first level interconnect is deposited. Once deposition of the first level interconnect occurs, a polishing process removes any excess material that remains outside of the trench formed.

Assuming that the first level interconnect has been formed as a single inlaid structure, the remainder of the second ILD is formed subsequent to the polishing step. An interconnect that can include a conductive barrier film and a copper material is then formed within the second ILD. The barrier film is typically a refractory metal, a refractory metal nitride, or a combination of refractory metals or their nitrides. The copper fill material is typically copper or a copper alloy, where the copper content is at least 95 atomic percent. The copper can be alloyed with magnesium, sulfur, carbon, or the like to improve adhesion, electromigration or other properties of the interconnect. Interconnects can alternatively be formed in other manners, for example, as a conductive plug in combination with a dual inlaid interconnect or as a lithographically patterned and etched interconnect.

Adhesion between various interconnect layers in a semiconductor device is an important characteristic. If adhesion between layers is inadequate in the device, problems are presented, such as delamination, separation of layers, inter-diffusion of layers, and other physical faults that can lead to decreased performance, electrical shorts, opens, and structural integrity concerns. Adequate adhesion between layers is, therefore, an objective in the semiconductor manufacture process.

Conventionally, various materials have been used as barrier layers in semiconductor devices. For example, barrier layers are typically formed atop surfaces of a dielectric layer prior to formation of a next conductive layer. Often, it is important, or at least beneficial, if the barrier layer employed in the application to prevent inter-diffusion between interconnect metals and dielectrics can also serve to increase the adhesion between the metal interconnect and dielectric. Furthermore, the barrier layer material can provide a seed layer for metal deposition to the surface of the dielectric, and act to keep the process chemistry from interaction with underlying layers. In typical inlaid Cu metal structures Ta or TaN forms the barrier layer between Cu and the dielectric trenches and vias.

In a conventional inlaid process forming an interconnect structure, a trench is formed in an interlevel dielectric (ILD) layer. The ILD layer is typically silicon dioxide (SiO2), doped silicon dioxide, an organic polymer, or some other dielectric material. A way of forming the SiO2 ILD is CVD or PECVD processes using tetraethyloxysilane or alternatively a process using tetraethyloxysilane in combination with a fluorine source to form fluorine containing SiO2 (FTEOS). In order to provide a barrier for the next metal layer on the ILD layer and within the trench and trench via (i.e., the "inlaid structure") formed in the ILD layer, the barrier material, which can also serve to increase adhesion, is typically formed on the dielectric surface. A conventional example of the barrier layer is Ta or its nitride deposited on the surface of the ILD layer prior to the deposition of copper as the metal interconnect layer.

As is conventional, an inlaid interconnect structure is formed within the trench and via of the interlevel dielectric layer after the barrier layer is deposited. It is desirable that the barrier layer serve to prevent delamination and inter-diffusion of the metal layer. As mentioned, however, the conventional barrier layer materials have proven problematic, particularly when tantalum is interconnected with copper through trench and via structures in the inter-level dielectric layer, such as FTEOS. It has been experienced that the tantalum metal in such instances tends to delaminate from the ILD layer because of adhesion problems and that the metal material can inter-diffuse into the ILD layer and migrate causing electro-migration concerns.

The conventional process for the formation of the barrier layer in dual or single inlaid copper interconnects is to form a continuous Ta or TaN film, i.e. a barrier layer or film, on the ILD using a noble gas plasma to sputter metal atoms from a Ta target onto a semiconductor device substrate. The forming of Ta or TaN as a barrier layer is determined by the gas(es) in the vacuum vessel ("gas ambient") in which the barrier layer formation occurs. For example, the conventional barrier layer for inlaid copper interconnects is formed using tantalum and argon gas combination or tantalum, argon and nitrogen gas combination in the presence of a plasma energized (sustained) by electric energy applied to the Ta sputter electrode. Alternatively, in addition to the Ta sputter electrode, other electrodes can be energized to assist (sustain) the plasma and direct ions. Examples of these are: power can be applied to the device substrate electrode to assist ion collection and a third electrode positioned to the periphery, but not between the Ta target and substrate, can be energized to increase the quantity of charged ions. The three power sources are identified as a metal sputtering DC power source, a radio frequency AC power source, and a wafer bias radio frequency power source. The resulting wafer from the process has a Ta or tantalum nitride surface portion, formed atop the dielectric material. This tantalum nitride or Ta surface atop the dielectric serves as a barrier layer for a next metal layer of copper deposited over the dielectric layer.

The tantalum barrier adhesion to the dielectric material exhibits the problems previously described. An improvement in adhesion of the barrier layer metal, such as Ta, to a dielectric layer, such as silicon dioxide, TEOS, or FTEOS, would be a significant advantage and improvement in the art and science.

BRIEF DESCRIPTION OF THE DRAWINGS

The present invention is illustrated by way of example and not limitation in the accompanying figures in which like references indicate similar elements, and in which.

Figure 1:
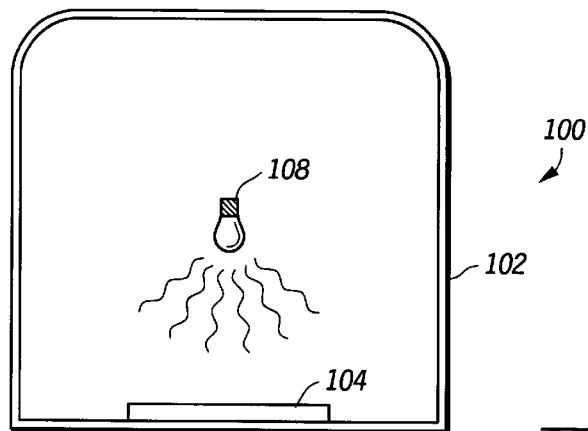
FIG. 1 includes a prior art degassing apparatus.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Adhesion of the barrier layer to the underlying dielectric in a semiconductor substrate device is improved by employing a treating gas in a glow discharge process of the dielectric. Such treating and process provides increased strength to the next interconnect layer without altering the function of the barrier layer to limit Cu diffusion into the dielectric and electromigration. In certain embodiments, an adhesion region is formed in a dielectric layer, and a barrier layer is formed atop the adhesion region in the inlaid structure of a semiconductor wafer. The inlaid trench structure is connected to upper or lower metal layers through vias in the dielectric layer to a copper layer. The adhesion region and barrier layer are formed in vacuum by baking the wafer, applying an rf clean using a noble gas, flowing a treating gas while concurrently activating at least one power source but de-energizing any sputtering target power source. The treating gas can be nitrogen, hydrogen, contain carbon atoms, or some other suitable gas.

Referring to FIG. 100, a degassing device 102 contains a semiconductor substrate device 104. The semiconductor substrate device 104 may take the form of a monocrystalline semiconductor wafer, a semiconductor-on-insulator (SOI) substrate, or any other substrate suitable for use in the formation of semiconductor devices. The semiconductor device substrate 104, as is conventional, includes various layers of materials, which are respectively insulating layers, conductive layers, active elements, passive elements, and other materials and structures. The semiconductor device substrate 104, for exemplary purposes and in order to illustrate embodiments of the invention, includes a metal layer, such as copper, aluminum, or other metal. Atop the metal layer is an interlevel dielectric (ILD) layer, such as $SiO_2$ or fluorine-doped $SiO_2$ or some other dielectric material. The $SiO_2$ ILD can be formed, for example, using CVD or PECVD processes that use tetraethyloxysilane (TEOS). The ILD layer is formed with a via and trench interconnect structure through the ILD layer to the contact metal layer. The semiconductor device substrate 104 is manufactured in conventional manner and is a conventional structure, as just described.

The degassing device 100 includes a vacuum enclosure 102. Within the vacuum enclosure 102 is located a heat source 108, for example, a halogen lamp, heated chuck, or other heat source. The heat source 108 is connected to a power supply (not shown).

Within the degassing device 102, the semiconductor substrate device 104 is heated for degassing. The degassing removes moisture and other contaminates from the semiconductor substrate device 104. The degassing of the semiconductor substrate device 104 is conventional in preparation of the semiconductor substrate device 104 for a metal deposition atop the ILD layer of the semiconductor substrate device 104.

Figure 2:
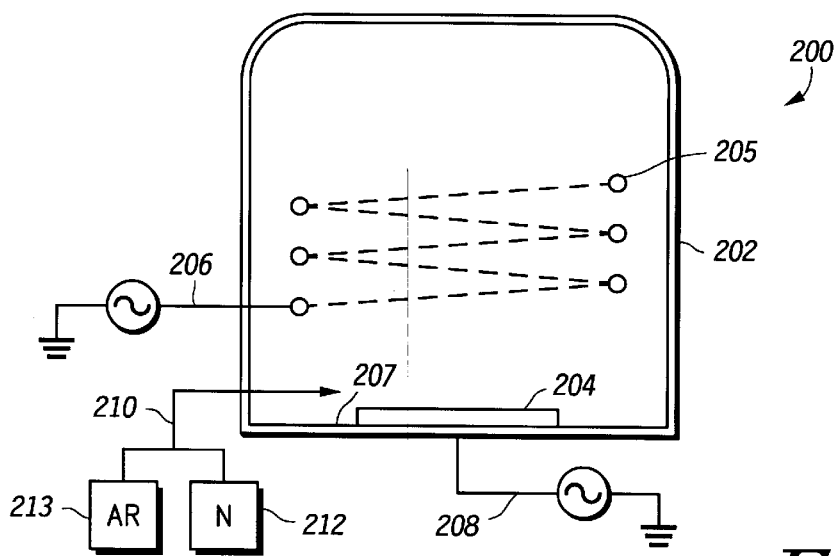
FIG. 2 includes an illustration of a prior art radio frequency pre-cleaning device.

Referring to FIG. 2, the semiconductor substrate device 104, after degassing in the degassing device 100, is placed in a radio frequency (rf) pre-clean apparatus 200 (also referred to as rf clean chamber) without breaking vacuum. The rf preclean apparatus 200 includes a vacuum enclosure 202. Within the vacuum enclosure 202 is located a semiconductor substrate device 204 which is the semiconductor substrate device 104 of FIG. 1 after degassing. Also within the vacuum enclosure 202 is contained radio frequency coils 205. The radio frequency coils 205 are powered by a radio frequency power supply 206. The semiconductor substrate device 204 sits on a plate 207 connected to a power supply 208.

A radio frequency preclean process is performed on the semiconductor substrate device 204 in the rf preclean apparatus 200. In this preclean process step, a gas supply 210 feeds gas, such as argon, to within the vacuum enclosure 202. The coils 205 are powered by the power supply 206, and the heating plate 207 is powered by the power supply 208. Radio frequency plasma generated within the vacuum enclosure 202 serves to clean the semiconductor substrate device 204 at an upper surface of the device 204.

It is notable that, in the preclean apparatus 200, the gas supply 210 includes supplies of, for example, a nitrogen gas 212 and an argon gas 213. Treating gases, such as nitrogen, are not typically employed at the preclean process stage. However, such gases are critical to embodiments of the present invention. As will later be more fully detailed herein, an adhesion region at a surface of the semiconductor substrate device is formed prior to the metal deposition process, for example, at the preclean stage in the preclean apparatus 200, serves for better adhesion with no decrease in barrier layer protection in the semiconductor substrate device.

Figure 3:
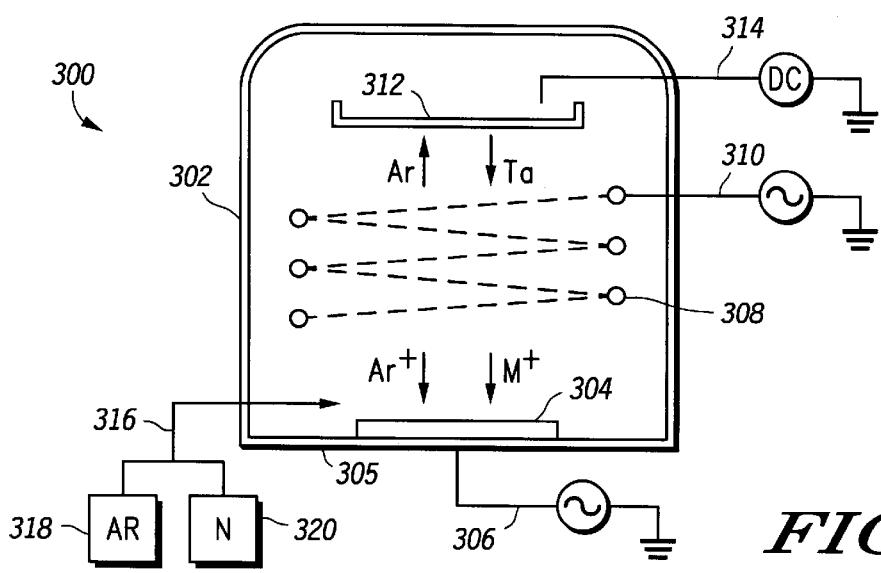
FIG. 3 includes an illustration of a metal deposition chamber, operable to form an improved barrier layer at a surface of a dielectric layer prior to sputtering of metal.

Referring to FIG. 3, a metal deposition process is performed by a metal deposition chamber 300. The chamber 300 includes a vacuum enclosure 302. Within the vacuum enclosure 302, a semiconductor substrate device 304 is located on a plate 305. A bias power source 306, also referred to as a wafer bias source, connects with the semiconductor substrate device 304.

A radio frequency coil 308 is located within the vacuum enclosure 302. A radio frequency power source 310 connects to the coil 308. Also within the vacuum enclosure 302 is positioned a metal target 312. The metal target 312 is connected to a target power source 314 and performs sputter deposition of a metal on the device 304 when the target 312 is energized by the power source 314. The metal target 312 is selectively energized as herein described, and serves as an energized refractory metal target for sputtering tantalum or other refractory metal.

The metal deposition chamber 300 is connected with a gas manifold 316. The gas manifold 316 is connected with supplies of gases, such as an argon gas supply 318 and a nitrogen gas supply 320. Nitrogen gas is particularly effective in embodiments of the present invention in which a metal interconnect, also referred to as conductive layer, of the semiconductor substrate device 304 is copper.

Prior to sputtering metal onto the semiconductor substrate device 304, an adhesion region is formed atop a dielectric layer of the semiconductor substrate device 304. The adhesion region of the semiconductor substrate device 304 is formed by turning off or otherwise de-energizing the power source 314 to the metal target 312 (i.e., the refractory metal target), while maintaining the power on or otherwise energizing the rf power source 310, the radio frequency bias power source 306, or both. Simultaneously, a treating gas or treating gas/noble gas mixture such as, for example, plasma of nitrogen or an argon-nitrogen mix, is fed to the vacuum enclosure 302 from the argon gas supply 318 and the nitrogen gas supply 320 through the gas manifold 316. The nitrogen, or argon and nitrogen mix, as the case may be, is fed in quantities of approximately about 65 sccm, at temperatures of approximately about 100 C, and pressures of approximately about 40 mT, or in such other quantities, temperatures and pressures as are appropriate to obtain similar results. A plasma of the nitrogen, or argon-nitrogen mix, forms within the vacuum enclosure 302 and is maintained in the vicinity of the semiconductor substrate device 304 surface for approximately about 3 seconds or such other time period as is appropriate to obtain similar results.

The energized treating gas ions (that is, the excited gas) of the nitrogen plasma, or alternatively argon and nitrogen mix, form a silicon dioxide:nitrogen ($SiO_2$:N) adhesion region or interlayer within the surface of the dielectric layer. This thin adhesion/interlayer region of treated ILD serves as an adhesion interface, and provides improved results for adhesion function at the surface of the dielectric layer. After the adhesion/interlayer region is formed in such manner, a barrier layer of refractory metal, such as, for example, tantalum, titanium, or tungsten, is sputtered onto the surface of the semiconductor substrate device 304. The barrier layer conforms to the topography of the vias and trenches for interconnect structures formed in the dielectric layer. The physical structures of the semiconductor device substrates 104, 204, and 304, as well as the resulting semiconductor device substrate from the adhesion/interlayer region formation and the barrier layer deposition process, are hereafter described in more detail.

Figure 4:
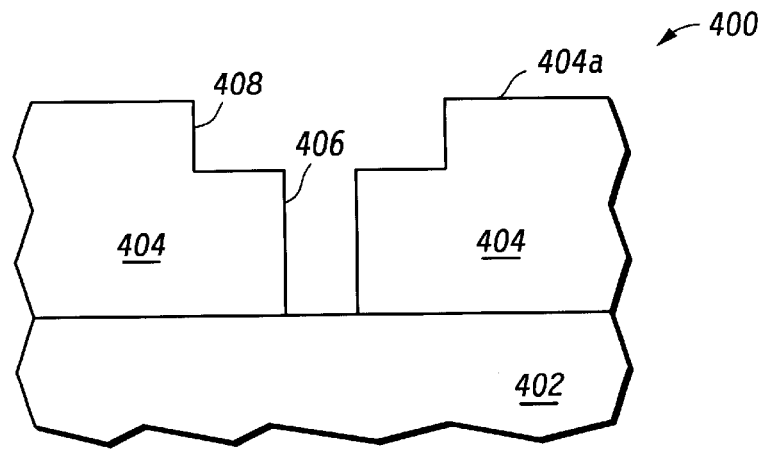
FIG. 4 includes a cross-sectional view illustrating a metal layer and a dielectric layer formed with a trench and via of an inlaid interconnect structure.

Referring to FIG. 4, in conjunction with FIG. 1, an inlaid structure 400 of the semiconductor substrate device 104 of FIG. 1 is formed through an interlevel dielectric layer (ILD) 404. The semiconductor substrate device 104 includes a conductive layer 402, such as a copper metal layer, although aluminum or other metal is possible, that is topped with the ILD layer 404. The interconnect structure 400 is, for example, of the type formed in the semiconductor substrate device 104 of FIG. 1, although the device 104 and the structure 400 are each intended only to be exemplary for purposes of illustration.

The ILD layer 404 includes a trench 408, formed by etching of the ILD layer 404 or other conventional techniques. Within the trench 408, a via opening 406 is formed through the ILD layer 404 to the conductive layer 402. The via opening 406, like the trench 408, is formed in conventional manner, such as through successive process steps like resist spin, photolithography, etching, polishing, or other conventional steps, as those skilled in the art will know and appreciate.

Figure 5:
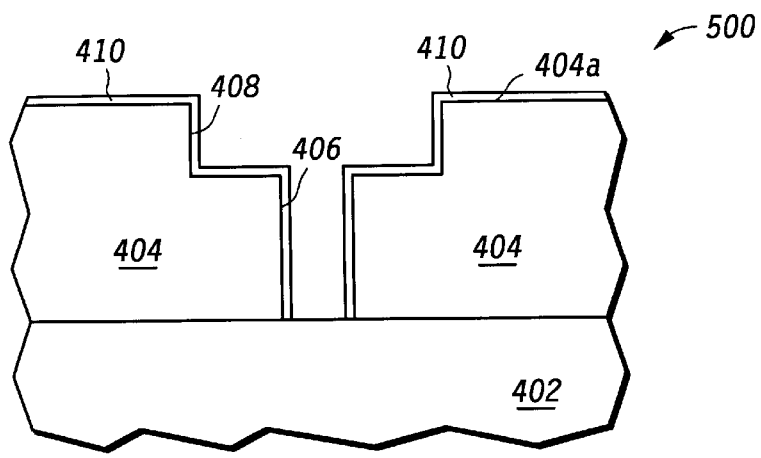
FIG. 5 includes a cross-sectional view illustrating the interconnect structure of FIG. 4 formed with an adhesion/interlayer region at the surface of the dielectric material, according to an embodiment of the present invention.

Referring to FIG. 5, in conjunction with FIGS. 1 and 2, after degassing of the semiconductor substrate device 104 having the interconnect structure 400 via the device 100 of FIG. 1 and also after radio frequency precleaning via the cleaning device 200 of FIG. 2, an adhesion/interlayer region 410 is formed on a surface 404a of the ILD layer 404. The interconnect structure 400 of FIG. 4, after formation of the adhesion/interlayer region 410, is identified as interconnect structure 500 in FIG. 5. The adhesion/interlayer region 410 of the interconnect structure 500 is formed at a point in processing of the semiconductor substrate device 104 after precleaning, if precleaning steps are applicable, but before barrier layer deposition within the interconnect structure 500. The adhesion/interlayer region 410 can, for example, be formed at any time in the manufacture sequence after degassing and, if applicable, precleaning, but before barrier layer deposition, for example, while the semiconductor substrate device 104 is located in the radio frequency preclean apparatus 200, in the metal deposition chamber 300, or in some other vacuum enclosure (not shown in detail) in other physical locations.

In any event, the adhesion/interlayer region 410 is formed by flowing a treating gas, such as nitrogen, either alone or in combination with other gas(es), such as argon or other gas, concurrently with at least one electrode energized, but not the Ta (i.e., metal target) electrode, to initiate and sustain a plasma. For example, combinations of power sources (other than the target electrode) are possible in the flowing of the treating gas, such as the rf power source 206 or 310 in combination with the plate power source 208 or the bias power source 306, respectively, depending whether the device 304 is located in the preclean device 200, the sputtering chamber 300, or elsewhere. This formation of the adhesion/interlayer region 410 creates a physical matrix of dielectric incorporated with treating gas atoms into a depth of the surface 404a of the dielectric material of the dielectric layer 404.

While the treating gas atom combination is silicon dioxide:nitrogen, a thickness of the adhesion/interlayer region or interphase 410 is on the order of approximately about 100 Å. The depth of the treating gas combination into the dielectric layer should be at least on the order of approximately about 10 Å, or other depth to attain an adhesion force sufficient to withstand delamination of layers at about 8 $J/m^2$ of force or greater. A thickness (i.e., depth into the dielectric layer 404) of the adhesion/interlayer region 410 can be varied as desired, by use of different reactive gases, different concentrations of gases, variation of temperatures, pressures, and power supplied, such as from the radio frequency power source and the bias source, and by other adjustments to power, compositions, temperature, pressure, and timing.

It is notable that the adhesion/interlayer region 410 is formed within the dielectric layer 404 physical structure as an inter-diffusion of the dielectric material with the treating gas ions. In contrast, the conventional formation of barrier material occurs atop the dielectric material, and the barrier material is typically a separate and distinct material layer deposited atop the surface. There is not any significant doping or inter-diffusion of the dielectric material and the barrier material in the conventional devices. The conventional deposition of such separate and distinct barrier material is not so effective in providing adequate adhesion as the adhesion/interlayer region 410 of the dielectric/reactive gas combination formed in the surface of the dielectric in accordance with the present embodiments.

Figure 6:
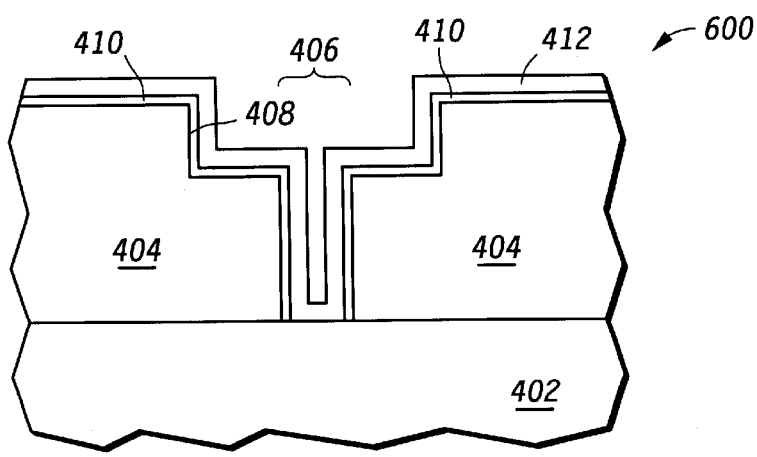
FIG. 6 includes a cross-sectional view illustrating the interconnect structure of FIG. 5 after sputtering of a metal layer within the interconnect structure and atop the adhesion/interlayer region of the dielectric material.

Referring to FIG. 6, after forming the adhesion/interlayer region 410 according to the embodiments herein, a barrier layer 412, such as a refractory metal, is deposited atop the adhesion/interlayer region 410. An interconnect structure 600 is the interconnect structure 500 of FIG. 5, after deposition of the barrier layer 412. The barrier layer 412 lines the trench 408 and the via opening 406 portions of the interconnect structure 600, as well as isolation portions of the structure 600.

Figure 7:
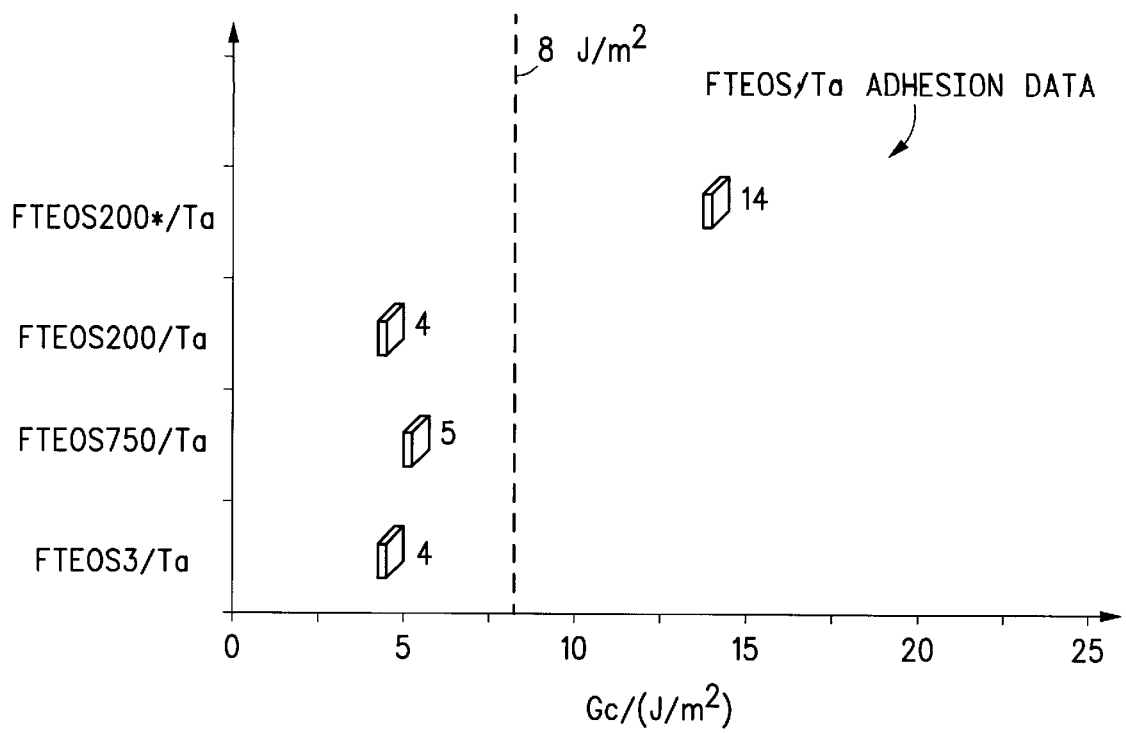
FIG. 7 includes a graph for comparing relative delamination strengths of semiconductor substrate devices formed with an adhesion/interlayer region and without such a region.

Referring to FIG. 7, delamination strengths of semiconductor device substrates manufactured according to the embodiments described herein of forming the adhesion/interlayer region prior to barrier layer deposition are compared with the strengths of conventional devices which do not include any adhesion/interlayer region. As shown, in the exemplary results of the comparison, delamination strengths are increased by forming the adhesion/interlayer region prior to barrier layer deposition.

Figure 8:
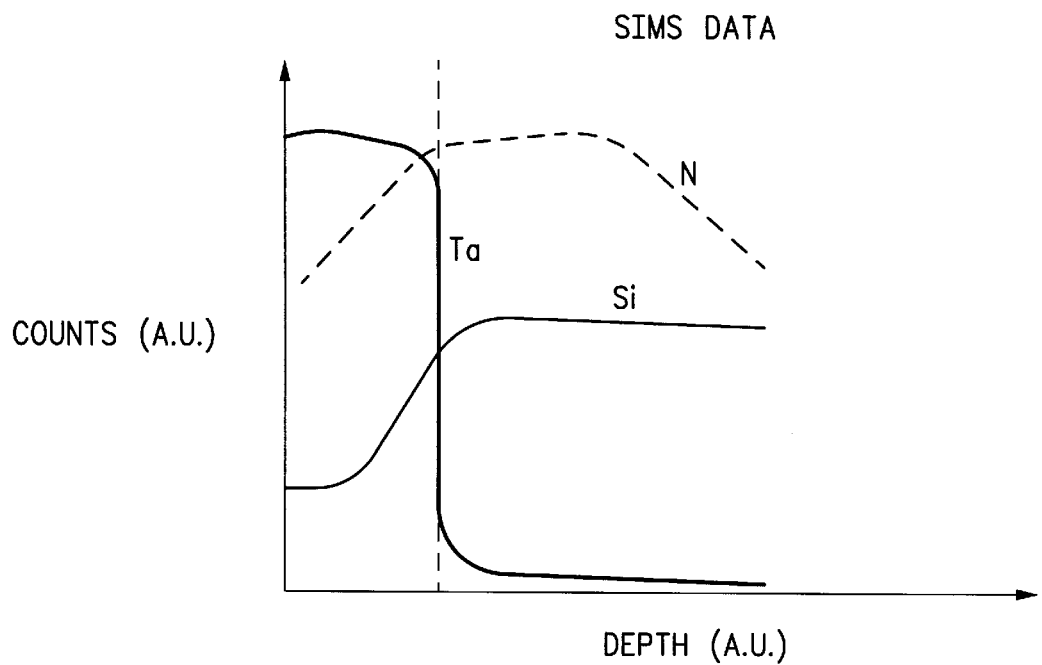
FIG. 8 includes an exemplary graph of secondary ion mass spectrum (SIMS) data for semiconductor devices formed with an adhesion/interlayer region.

Referring to FIG. 8, exemplary SIMS data for semiconductor device substrates manufactured according to the embodiments described herein shows the regions of N and Si matrix of the adhesion/interlayer region extending into a depth of the device under the Ta barrier, as a result of the adhesion/interlayer region.

By applying up to two power sources, but not the target electrode power source, and exposing the surface of the ILD layer of the semiconductor device substrate to nitrogen, either alone or in combination with other noble gas such as argon, the adhesion/interlayer region formed within the surface of the dielectric layer provides improvement in adhesion and barrier properties on deposition of the barrier layer. Numerous alternatives are possible in the foregoing, including, for example, similar adhesion/interlayer region formation results can be achieved by commencing to perform a conventional metal sputtering operation and flowing a treating gas plasma for a short time followed by turning off the treating gas. This is, in effect, a burst scenario in which the short and immediate flowing of the treating gas serves to form the adhesion/interlayer region as a combination of the dielectric/treating gas element as previously described.

In other alternatives, the adhesion/interlayer region 410 is formed prior to the metal deposition, in a chamber other than the metal deposition chamber. The chamber for the adhesion/interlayer region formation can be the radio frequency precleaning device or some other completely separate device. In any event, the adhesion/interlayer region formation is accomplished in the absence of a metal sputtering target that is energized.

In other alternatives, the dielectric of the dielectric layer can be any of a wide variety of materials. The gases employed to form the adhesion/interlayer region must be varied, according to the make-up of the dielectric material. For example, the dielectric could be a modified silicon dioxide, such as silicon dioxide which is deposited a manner to create physical voids in the material, a chemically modified silicon dioxide (e.g., CVD films), various organic polymers, and other combinations and compositions. In such instances, nitrogen or other treating gases can be employed with additional or alternative gases to argon and other noble gases, such as, for example, acetylene, ammonia or other gases that are suitable as a source of carbon.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and any element(s) that may cause any benefit, advantage, or solution to occur or become more pronounced are not to be construed as a critical, required, or essential feature or element of any or all the claims. As used herein, the terms "comprises, "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a barrier in an inlaid structure in a semiconductor wafer, wherein the inlaid structure is through a dielectric layer to a copper layer, comprising the steps of:

baking the integrated circuit;

applying an rf clean using a noble gas to the integrated circuit;

placing the semiconductor wafer in a sputtering chamber comprising a selectively energized tantalum target, a wafer bias source, and an rf power source;

flowing a treating gas containing one or more elements selected from nitrogen, carbon, and hydrogen into the sputtering chamber while the rf power source is activated, the wafer bias source is energized, and the tantalum target is de-energized; and flowing argon into the sputtering chamber while the rf power source is activated and the tantalum target is energized.

2. The method of claim 1, wherein the treating gas is nitrogen.

3. The method of claim 1, wherein the treating gas contains carbon.

4. A method for forming a tantalum barrier in an inlaid structure in a semiconductor wafer, wherein the inlaid structure is through a dielectric layer to a conductive layer, comprising the steps of:
prior to applying tantalum to the inlaid structure, treating the inlaid structure with a plasma gas containing an element selected from nitrogen, carbon, and hydrogen while the semiconductor wafer is biased by an energized wafer bias source; and
depositing tantalum in the inlaid structure.

5. The method of claim 4, wherein there is an interface between the tantalum and the inlaid structure which contains the element selected from nitrogen, carbon, and hydrogen.

6. The method of claim 5, wherein the step of depositing tantalum includes depositing nitride so that the barrier layer is tantalum nitride.

7. The method of claim 6, wherein the plasma gas is nitrogen.

8. The method of claim 4, wherein the plasma gas is acetylene.

9. The method of claim 4, wherein the plasma gas is ammonia.

10. A method for forming a tantalum barrier in an inlaid structure in a semiconductor wafer, wherein the inlaid structure is through a dielectric layer to a conductive layer, comprising the steps of:
inserting the semiconductor wafer into an rf clean chamber;
applying an rf clean, using a noble gas, to the inlaid structure; and
prior to removing the semiconductor wafer from the rf clean chamber, treating the inlaid structure with a treating gas selected from ionized carbon, nitrogen, or hydrogen while the semiconductor wafer is biased by a wafer bias source that is energized; and
depositing tantalum in the in-laid structure to form the tantalum barrier.

11. The method of claim 10, wherein there is an interface between the tantalum and the inlaid structure that contains the element selected from nitrogen, carbon, and hydrogen.

12. The method of claim 10, wherein the treating gas is ionized nitrogen.

13. The method of claim 10, wherein the noble gas is argon.

14. The method of claim 10, wherein the treating gas is ionized carbon.

15. A method for forming a refractory metal barrier in an inlaid structure in a semiconductor wafer, wherein the inlaid structure is through a dielectric layer to a conductive layer, comprising the steps of:
prior to applying the refractory metal to the inlaid structure, applying a treating gas selected from ionized carbon, nitrogen, or hydrogen to the inlaid structure while the semiconductor wafer is biased by a wafer bias source that is energized; and
depositing the refractory metal in the inlaid structure.

16. The method of claim 15, wherein the treating gas is ionized nitrogen, the dielectric is silicon oxide, and a nitrogen-containing silicon dioxide is formed in the inlaid structure prior to depositing the refractory metal barrier.

17. The method of claim 16, wherein the silicon oxide is formed from TEOS.

18. The method of claim 17, wherein the silicon oxide is fluorine-doped.

19. The method of claim 15, wherein the in-laid structure has an exposed surface and wherein the surface incorporates an element of the treating gas.

20. The method of claim 19, wherein the treating gas is formed by exciting a gas which contains an element selected from nitrogen, carbon, and hydrogen.

21. The method of claim 15, further comprising:
prior to applying the treating gas, placing the semiconductor in a sputtering chamber; and
applying the treating gas in the sputtering chamber.

22. The method of claim 21, wherein the sputtering chamber has a selectively energized refractory metal target that is de-energized while the treating gas is applied.

23. The method of claim 15, further comprising:
placing the semiconductor wafer in a treatment chamber where the step of applying the treating gas is performed;
placing the semiconductor wafer in an rf clean chamber; and
placing the semiconductor wafer in a sputtering chamber where the step of depositing the refractory metal is performed.

24. The method of claim 15, further comprising:
inserting the semiconductor wafer into an rf clean chamber;
applying an rf clean, using a noble gas, to the inlaid structure; and
prior to removing the semiconductor wafer from the rf clean chamber, treating the inlaid structure with the treating gas.

* * * * *